(12) United States Patent
Kato

(10) Patent No.: US 7,196,945 B2
(45) Date of Patent: Mar. 27, 2007

(54) SEMICONDUCTOR MEMORY

(75) Inventor: Tatsuhiro Kato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 63 days.

(21) Appl. No.: 10/901,260

(22) Filed: Jul. 29, 2004

(65) Prior Publication Data

US 2005/0024940 A1 Feb. 3, 2005

(30) Foreign Application Priority Data

Jul. 31, 2003 (JP) .............................. 2003-284028

(51) Int. Cl.
*G11C 16/04* (2006.01)
(52) U.S. Cl. ........................... 365/189.07; 365/189.09; 365/210
(58) Field of Classification Search ........... 365/189.07, 365/189.09, 210

See application file for complete search history.

(56) References Cited

U.S. PATENT DOCUMENTS

| | | | | |
|---|---|---|---|---|
| 5,592,428 A | * | 1/1997 | Harrand et al. ............. | 365/210 |
| 6,201,742 B1 | * | 3/2001 | Hirai et al. ............. | 365/189.09 |
| 6,301,156 B1 | * | 10/2001 | Kurosaki ................. | 365/185.2 |
| 6,512,714 B2 | * | 1/2003 | Hanzawa et al. ........... | 365/210 |
| 6,590,820 B2 | * | 7/2003 | Nakagawa ................... | 365/207 |
| 6,809,977 B1 | * | 10/2004 | Richards ..................... | 365/210 |
| 6,822,897 B2 | * | 11/2004 | Ishikawa ..................... | 365/171 |

FOREIGN PATENT DOCUMENTS

JP 3-73493 3/1991

* cited by examiner

*Primary Examiner*—David Lam
(74) *Attorney, Agent, or Firm*—McGinn IP Law Group, PLLC

(57) ABSTRACT

A semiconductor memory has a plurality of memory cells having a single-ended digit structure. When reading data from a selected memory cell, a digit voltage outputted from the selected memory cell is compared with a reference voltage. If the digit voltage is higher, it is outputted as High level; if the digit voltage is lower, it is outputted as Low level. The semiconductor memory further has a plurality of dummy cells with different current capacity to generate a plurality of different levels of reference voltages.

20 Claims, 7 Drawing Sheets

SEMICONDUCTOR MEMORY

BACKGROUND OF THE INVENTION

1. Field of the Invention

The present invention relates to a semiconductor memory having a memory cell with a single-ended digit structure that reads data over a single digit line.

2. Description of Related Art

A semiconductor memory having a memory cell with a single-ended digit structure, as shown in FIG. 10, for example, is widely known. Japanese Unexamined Patent Application Publication No. 03-73493 (FIG. 2), for example, describes this kind of semiconductor memory.

The semiconductor memory 100 shown in FIG. 10 is Static Random Access Memory (SRAM). The semiconductor memory 100 has memory cells 101 arranged in an array composed of the n-number of rows and the m-number of columns (n and m are each positive integers of 2 and above), with n×m bits, and a word line driver circuit 102. Write word lines 103 and read word lines 104, each of the same number as rows (n-number), are derived from the word line driver circuit 102. The in-number of read/write shared digit lines 105 are formed, one for each column, and a column selector 106 for selecting one from the digit lines 105 to read or write data. Signal lines 107 are derived from the column selector 106 for transmitting a data write signal to selected memory cells 101 to which data is to be written and a data read signal (digit voltage) from selected memory cells 101 from which data is to be read. A column select signal driver circuit 108 outputs a column select signal to the column selector 106. To transmit the column select signal to the column selector 106, signal lines 109 of the same number as columns (m-number) are derived from the column select signal driver circuit 108. The semiconductor memory 100 further has the n-number of dummy cells 110, placed one for each row, for generating a reference voltage. A dummy digit line 111 is commonly connected to the source terminal of an access transistor 1101 of each dummy cell 110. The dummy digit line 111 and the signal line 107 are both connected to a complementary level comparing sense amplifier and data write buffer combined circuit 112.

Each read word line 104 is commonly connected, in each row, to the gate terminal of an access transistor 1011 of each of the memory cells 101 and also to the gate terminal of the access transistor 1101 of each of the dummy cells 110.

Each write word line 103 is commonly connected, in each row, to the gate terminal of a write address selection switch transistor 1012 of each of the memory cells 101.

Each digit line 105 is commonly connected, in each column, to the source terminal of the access transistor 1011 of each of the memory cells 101 and also to the drain terminal of the write address selection switch transistor 1012 of each of the memory cells 101.

When the semiconductor memory 100 having this structure reads data from the memory cell 101, a digit voltage outputted from a selected memory cell 101 via the digit line 105, and a reference voltage outputted from the dummy cell 110 in the same row as the selected memory cell 101 via the dummy digit line 111 are inputted to the complementary level comparing sense amplifier and data write buffer combined circuit 112. The circuit 112 amplifies a difference between the reference voltage and the digit voltage and then outputs the amplified voltage via a data output terminal 1121. In this time, the circuit 112 compares the digit voltage with the reference voltage, and, if the digit voltage is higher, outputs the digit voltage as High level; on the other hand, if the digit voltage is lower, outputs it as Low level.

As described above, the semiconductor memory 100 having the memory cells 101 with the single-ended digit structure generates a reference voltage for data readout from the memory cell 101.

Since driver transistors 1102 of the dummy cells 110 have equal current capacity, the dummy cells 110 also have equal current capacity. Thus, each dummy cell 110 outputs a reference voltage of the same level. In other words, the semiconductor memory 100 generates a single reference level.

In data read operation in the semiconductor memory 100, high-speed data output is possible if the level of a reference voltage outputted from the dummy cell 110, which is a reference level, is a center voltage level between High and Low levels of a digit voltage outputted from the memory cell 101, which is referred to hereinafter simply as a center level.

However, a reference voltage in a finished chip can be different from a simulation result at the time of design. This is because the reference voltage varies from a desired value due to a variation in transistor capacity (the current capacity of the driver transistor 1102 in the dummy cell 110) and a variation in capacity of the dummy digit line 111. It is thereby difficult to obtain a reference voltage in a finished chip having a center level between High and Low levels of memory cell data (digit voltage). If the reference level is not the center level, a difference between the reference voltage and the digit voltage becomes undesirably small to cause degradation (delay) in data output time or access time.

Specifically, the reference level becomes higher than the center level if the transistor capacity of the dummy cell 110 is small or the capacity of the dummy digit line 111 is large. A difference between High level of the digit voltage and the reference level thereby becomes small, causing delay in output time of High level data. On the contrary, the reference level becomes lower than the center level if the transistor capacity of the dummy cell 110 is large or the capacity of the dummy digit line 111 is small. A difference between Low level of the digit voltage and the reference level thereby becomes small, causing delay in output time of Low level data.

The above problems are explained hereinbelow in detail with reference to FIG. 11 to 13.

FIGS. 11 to 13 show a change in waveform of a digit voltage D and a reference voltage RDD with time in data read operation. FIG. 11 shows the case where the reference level is a center level, FIG. 12, where it is higher than the center level, and FIG. 13, where it is lower than the center level.

The data read operation via the digit line 105 precharged with a precharge level (VDD voltage) during stand-by time (precharge period) starts in synchronization with the rise in the read word line 104.

The complementary level comparing sense amplifier and data write buffer combined circuit 112 compares the digit voltage D with the reference voltage RDD, and, if the digit voltage D is higher, outputs the digit voltage D as High level; if the digit voltage D is lower, outputs it as Low level, from the data output terminal 1121, as described above.

At the timing when a difference S between the digit voltage D and the reference voltage RDD reaches a predetermined level, memory cell data with High or Low level of the digit voltage D is outputted.

Thus, in the case where the reference level is the center level as shown in FIG. 11, an elapsed time until the difference S reaches a predetermined level is equal when the memory cell data is High and when it is Low, allowing the output timing of the memory cell data to be the same. It is thereby possible to operate with a desired access time just like the simulation.

However, in the case where the reference level is higher than the center level as shown in FIG. 12, an elapsed time until the difference S reaches a predetermined level is delayed when the memory cell data is High, causing a delay in data output timing.

On the other hand, in the case where the reference level is lower than the center level as shown in FIG. 13, an elapsed time until the difference S reaches a predetermined level is delayed when the memory cell data is Low, causing a delay in data output timing.

In this way, if the reference level is not the center level, output timing of High or Low level data is delayed, which hinders high-speed data output as simulated at the time of design.

SUMMARY OF THE INVENTION

In view of the foregoing, it is an object of the present invention to provide a semiconductor memory that outputs data at high-speed to allow shorter access time, preferably without increasing the area of the semiconductor memory.

To these ends, according to one aspect of the present invention, there is provided a semiconductor memory comprising a plurality of memory cells, from each of which data is read via a line; a reference level generator circuit having a plurality of reference cells and being constructed to be capable of generating different reference levels with the plurality of reference cells; and a comparator circuit for comparing an output level from one of the memory cells with a reference level outputted from the reference level generator circuit, and outputting read data based on a comparison result.

In this semiconductor memory, the plurality of reference cells may have different current capacity. A driver transistor in each of the plurality of reference cells may have different current capacity. At least one parameter of gate length, gate width, and stage number of the driver transistor in each of the plurality of reference cells may be different from each other.

In the above semiconductor memory, each of the plurality of reference cells may output a voltage via a common line. Further, each of the plurality of reference cells may be driven by a drive signal via a common line. In this semiconductor memory, the reference level generator circuit may have the same number of reference cells as columns in a memory cell array including the plurality of memory cells, and a gate width and a gate length of an access transistor in each of the plurality of memory cells or the plurality of reference cells may be substantially equal.

In the above semiconductor memory, the reference level generator circuit may have the smaller number of reference cells than columns in a memory cell array including the plurality of memory cells, and the plurality of reference cells maybe arranged in a row direction of the memory cell array.

In the above semiconductor memory, a capacitor connected to an output terminal of each of the plurality of reference cells may have a substantially equal value to a capacitor connected to an output terminal of each of the plurality of memory cells. In this semiconductor memory, a diffusion capacitor may be connected to an output terminal of each of the plurality of reference cells.

In the above semiconductor memory, the comparator circuit may have a complementary level comparing sense amplifier for receiving a reference level and an output level from one of the memory cells, amplifying and outputting a difference between the two levels.

In the above semiconductor memory, a reference level generation command signal may be individually inputted to each of the plurality of reference cells.

In the above semiconductor memory, each input path of a generation command signal to each of the plurality of reference cells may have a fuse for, if a corresponding reference cell is not selected to generate a reference level, invalidating input of the generation command signal to the corresponding reference cell.

In the above semiconductor memory, the reference level generator circuit may output an output voltage of one reference cell selected from the plurality of reference cells as a reference level. In this semiconductor memory, the selected reference cell may output a voltage level closest to a center level between two levels in a line used to read data from one of the memory cells. A reference level generation command signal may be selectively inputted to the selected reference cell of the plurality of reference cells. Input of the generation command signal may be invalidated by fuse cut to a reference cell not selected to generate a reference level. An external signal may control selection of one reference cell from the plurality of reference cells.

According to another aspect of the invention, there is provided a semiconductor memory comprising a plurality of memory cells, each for outputting a first level or a second level in accordance with stored data; a reference level generator circuit having a plurality of reference cells with different output levels, for generating a reference level with output from one reference cell preselected from the plurality of reference cells for outputting a substantially center level between the first and second output levels; and a comparator circuit for comparing an output level from one of the plurality of memory cells with a reference level outputted from the reference level generator circuit, and outputting read data based on a comparison result.

In this semiconductor memory, an output level from the selected reference cell may be closer to a center level between the first and second output levels than any other output levels from the plurality of reference cells.

A semiconductor memory according to the present invention has a plurality of dummy cells with different current capacities to generate a plurality of levels of reference voltages, and selectively uses an appropriate reference voltage which is a center level between High level and Low level of memory cell data. It is thus possible to achieve high-speed data output time and a shorter access time.

Further, each dummy cell generates a reference voltage based on a drive signal via a common dummy word line, that is, each dummy cell is driven by a single dummy word line, thereby eliminating a need for forming a plurality of rows of dummy cells. It is thus possible to achieve a target reference voltage without increasing the area of the semiconductor memory.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Preferred embodiments of the present invention are explained hereinafter with reference to the drawings. A semiconductor memory and its reference voltage generation method are described in the following embodiments.

Figure 1:
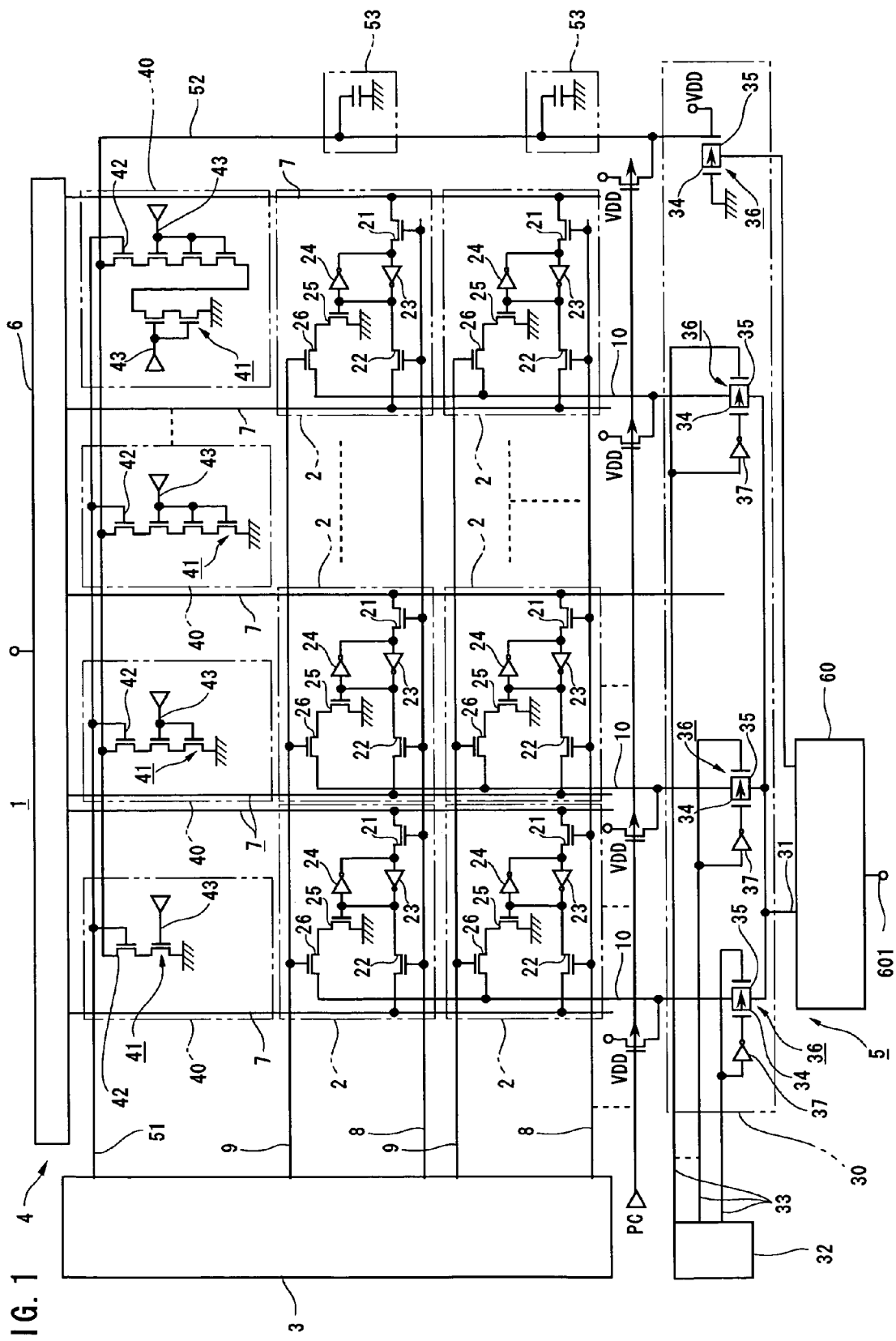
FIG. 1 is a circuit diagram illustrating a semiconductor memory according to a specific embodiment of the present invention.

FIG. 1 illustrates a circuit in the vicinity of a memory cell of a semiconductor memory 1 according to a specific embodiment of the present invention.

The semiconductor memory 1 of this embodiment is SRAM, for example, and it has an array of memory cells 2 composed of the n-number of rows and the m-number of columns, thus having n×m bits, a word line driver circuit 3 used for both write and read operation, a write-only port 4, and a read-only port 5.

The write-only port 4 has a known structure, for example, having a data write buffer 6 for temporarily buffering inputted write data and outputting the data, write digit lines 7 complementarily provided two lines for each column for transmitting data write signal outputted from the data write buffer 6, and write word lines 8 of the same number as rows (n-number) derived from the word line driver circuit 3.

The read-only port 5, on the other hand, has read word lines 9 of the same number as rows (n-number) derived from the word line driver circuit 3, read digit lines (single-ended digit lines) 10 provided one line for each column. It also has a column selector 30 for selecting one from the digit lines 10 used to read data, signal lines 31 derived from the column selector 30 for transmitting a data read signal (digit voltage) from a selected memory cells 2 from which data is to be read. It further has a column select signal driver circuit 32 for outputting a column select signal to the column selector 30, and signal lines 33 of the same number as columns (m-number), derived from the column select signal driver circuit 32 for transmitting the column select signal to the column selector 30. Further, the read-only port 5 has a plurality of dummy cells 40 for generating a reference voltage, dummy word lines 51 for transmitting a drive signal to the dummy cell 40, dummy digit lines 52 for outputting a reference voltage generated in the dummy cells 40, and a dummy capacitor 53 connected to the dummy digit line 52. It also has a complementary level comparing sense amplifier (which is also called a differential amplifier) 60, to which the dummy digit line 52 and the signal line 31 are connected.

Each of the memory cells 2 has a known structure, including data write access transistors 21 and 22, a pair of inverters 23 and 24 for retaining written data, a data read driver transistor 25, and a data read access transistor 26. In the data write access transistor 21, the gate terminal is connected to a corresponding write word line 8, the drain terminal is connected to a corresponding write digit line 7, and the source terminal is connected to a first connection of the inverters 23 and 24. In the data write access transistor 22, the gate terminal is connected to a corresponding write word line 8 (which is the same as the line to which the gate terminal of the data write access transistor 21 is connected), the drain terminal is connected to a corresponding write digit line 7 (which is different from the line to which the drain terminal of the data write access transistor 21 is connected), and the source terminal is connected to a second connection of the inverters 23 and 24 (which is an opposite to the connection to which the source terminal of the data write access transistor 21 is connected). The pair of inverters 23 and 24 have a latch structure where their input and output are cross-connected. In the data read driver transistor 25, the gate terminal is connected to the second connection of the inverters 23 and 24, the drain terminal is grounded, and the source terminal is connected to the drain terminal of the data read access transistor 26.

In the data read access transistor 26, the gate terminal is connected to a corresponding read word line 9, and the source terminal is connected to a corresponding read digit line 10. In other words, each read word line 9 is commonly connected, in each row, to the gate terminal of the data read access transistor 26 of each of the memory cells 2. Each read digit line 10 is commonly connected, in each column, to the source terminal of the data read access transistor 26 of each of the memory cells 2.

Since the memory cell 2 and the write-only port 4 each have known structure, data write operation in the semiconductor memory 1 is also widely known. Thus, the explanation of the data write operation is omitted.

The column selector 30 has a CMOS switch circuit 36 composed of a P-channel MOS transistor 34 and an N-channel MOS transistor 35 in each column. In each CMOS switch circuit 36, the source terminals of the transistors 34 and 35 are connected to each other, and the drain terminals of the transistors 34 and 35 are also connected to each other. Further, the gate terminal of the P-channel MOS transistor 34 is connected to a corresponding signal line 33 via an inverter 37, and the gate terminal of the N-channel MOS transistor 35 is connected directly to the signal line 33. One of the source terminal and drain terminal (for example, drain terminal) of the transistors 34 and 35 in each CMOS switch circuit 36 is connected to a corresponding read digit line 10. The other one of the source terminal and drain terminal (for example, source terminal), which is not connected to the read digit line 10, is commonly connected to the signal line 31.

The column select signal driver circuit 32 outputs a column select signal via one of the signal lines 33 in synchronization with the word line driver circuit 3 outputting a drive signal via one of the read word lines 9, thereby selecting one memory cell 2 from which data is to be read. Then, the memory cell data (High level or Low level) outputted from the data read access transistor 26 of the selected memory cell 2 is inputted to the complementary level comparing sense amplifier 60 via a corresponding read digit line 10, the drain-source of a corresponding CMOS switch circuit 36, and the signal line 31.

The number of the dummy cells 40 as reference voltage generating means is, for example, the same as the number of columns, m, in the array of memory cells 2. The dummy cells 40 are arranged in line in the column direction.

Each of the dummy cells 40 has a different current capacity and thereby generates a different level of reference voltage. Thus, in this embodiment, the m-number of levels of reference voltages, which is the same as the number of columns, are generated.

The dummy cells 40 each have a driver transistor 41 and an access transistor 42.

The gate terminal of the access transistor 42 in each dummy cell 40 is commonly connected to the dummy word line 51. Thus, each dummy cell 40 generates a reference voltage based on a drive signal via the common dummy word line 51.

The source terminal of the access transistor 42 in each dummy cell 40 is commonly connected to the dummy digit line 52. Thus, each dummy cell 40 outputs a reference voltage via the common dummy digit line 52.

Further, in the dummy cells 40, at least one parameter of gate width, gate length, and stage number in one driver transistor 41 is set differently from those in the other driver transistors 41 so that the driver transistors 41 have different current capacity from each other.

Thus, in the semiconductor memory 1 according to this embodiment, the current capacity of the driver transistor 41 differs by each dummy cell 40 so that the dummy cells 40 have different current capacity from each other. This allows the dummy cells 40 to generate a different level of reference voltage.

Specifically, in this embodiment, the number of stages of the driver transistor 41 is set differently in each dummy cell 40, as illustrated in FIG. 1. More specifically, the number of stages of the driver transistor 41 connected in series in each dummy cell 40 is 1, 2, 3, . . . , m, from the dummy cell 40 at the left. The smaller the number of stages of the driver transistor 41 is, the larger the current capacity of each dummy cell 40 is, and the larger the stage number is, the smaller the current capacity is. FIG. 1 illustrates the case where m=5.

If, in this way, the number of stages of the driver transistor 41 is different in each dummy cell 40, the drain terminal of the first stage transistor is grounded, and the source terminal of the first stage transistor is connected to the drain terminal of the next stage transistor, and so on. The source terminal of the final stage transistor is connected to the drain terminal of the access transistor 42.

The gate terminal of each driver transistor 41 is connected to a signal line 43, which is a transmission path of a generation command signal, for transmitting a drive signal (a reference voltage generation command signal). The reference voltage generation command signal can be thereby inputted individually to the driver transistor 41 of each dummy cell 40. If there are a plurality of stages of driver transistor 41, the gate terminal of each driver transistor 41 is commonly connected to a corresponding signal line 43.

A drive signal is inputted to the gate terminal of a given driver transistor 41 via one of the signal lines 43, thereby selecting the dummy cell 40 having this driver transistor 41 as a cell to generate a reference voltage.

The selected dummy cell 40 generates a reference voltage and outputs the voltage from the source terminal of the access transistor 42, which is an output terminal of the dummy cell 40. The reference voltage outputted from the dummy cell 40 is then inputted to the complementary level comparing sense amplifier 60 via the dummy digit line 52.

The complementary level comparing sense amplifier 60 receives a digit voltage which is the voltage of memory cell data outputted from the selected memory cell 2 by the operation of the column selector 30, and a reference voltage outputted from the selected dummy cell 40 by the input of a generation command signal.

The complementary level comparing sense amplifier 60 amplifies a difference between the digit voltage and the reference voltage and outputs the amplified voltage via a data output terminal 601. Specifically, the complementary level comparing sense amplifier 60 compares the digit voltage with the reference voltage, and outputs the digit voltage as High level if the digit voltage is higher, and as Low level if it is lower.

A total capacitance of the dummy capacitors 53 (sum of the capacitance of a plurality of dummy capacitors 53 as shown in FIG. 1) connected to the dummy digit line 52 is substantially equal to a capacitance connected to the output terminal, which is the source terminal of the data read access transistor 26, of each memory cell 2. Further, a CMOS switch circuit 36, which is similar to the circuit to which the read digit line 10 is connected, is connected to the dummy digit line 52. Thus, the load capacitance connected to the output side of the dummy cell 40 and the load capacitance connected to the output side of the memory cell 2 are substantially equal. As a result, the sizes of the two voltages (reference voltage and digit voltage) compared in the complementary level comparing sense amplifier 60 depend only on the current capacity of the driver transistor 41 of the dummy cell 40 and the data read driver transistor 25 of the memory cell 2, respectively.

The dummy capacitor 53 is composed of a diffusion capacitor, for example. In the CMOS switch circuit 36 connected to the dummy digit line 52, the gate terminal of the P-channel MOS transistor 34 is grounded, and the gate terminal of the N-channel MOS transistor 35 is connected to a power supply to have a VDD voltage.

Further, in this embodiment, in addition that the number of dummy cells 40 is the same as the number of columns in the memory cell array, the gate width and gate length of the access transistors 42 in the dummy cells 40 and those of the data read access transistors 26 in the memory cells 2 are substantially the same. This allows substantially equalizing the output timing of memory cell data from the memory cell 2 to the read digit line 10, and the output timing of a reference voltage from the dummy cell 40 to the dummy digit line 52 if the waveform rise timing and waveform distortion in the read word line 9 and the dummy word line 51 are substantially equal.

The operation is now explained with reference to FIGS. 2 to 4.

Figure 2:
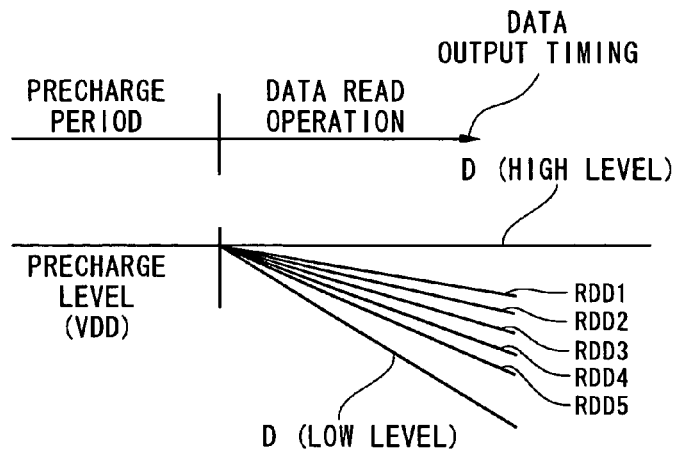
FIG. 2 is a view showing a plurality of levels of reference voltages and a change in the voltages during data read operation.

FIG. 2 shows a change in the waveform of a digit voltage D and a reference voltage RDD with time in data read operation. It shows the case where the first selected reference level is a center level.

Since the semiconductor memory cell 1 of this embodiment has five dummy cells 40, for example, it generates five different levels of reference voltages. Thus, there are five waveforms of the reference voltage RDD: RDD 1, RDD 2, RDD 3, RDD 4, and RDD 5, as shown in FIG. 2.

For example, RDD 3, which is the center level, is a reference level to be selected first. RDD 3 in FIG. 2 is substantially the same as the center level between High and Low levels of the digit voltage D.

The data read operation via the read digit line 10 precharged with a precharge level (VDD voltage) during standby time (precharge period) starts in synchronization with the rise in the read word line 9.

The complementary level comparing sense amplifier 60 compares the digit voltage D with the reference voltage RDD, and, if the digit voltage D is higher, outputs the digit voltage D as High level; on the other hand, if the digit voltage D is lower, outputs it as Low level.

At the timing when a difference S between the reference voltage RDD and the digit voltage D reaches a predetermined level, memory cell data with High or Low level of the digit voltage D is outputted.

Thus, if the reference level is the center level as shown in FIG. 2, an elapsed time until the difference S reaches a predetermined level is equal when the memory cell data is High and when it is Low, allowing the output timing of the memory cell data to be the same. It is thereby possible to operate with a desired access time just like the simulation.

Figure 3:
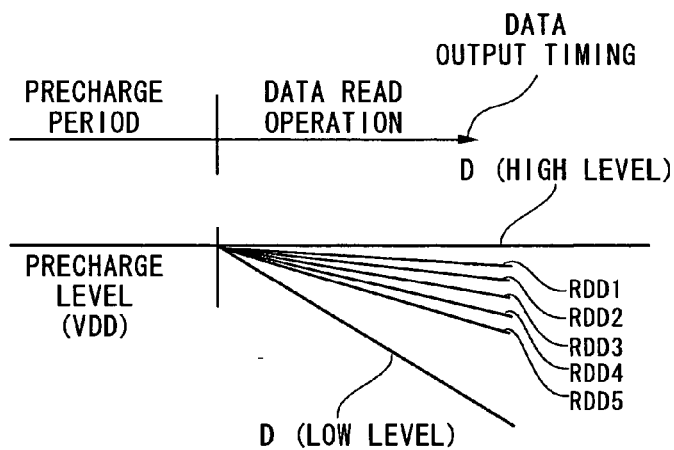
FIG. 3 is a view to explain adjustment when a first-selected reference voltage is higher than a center level.
Figure 4:
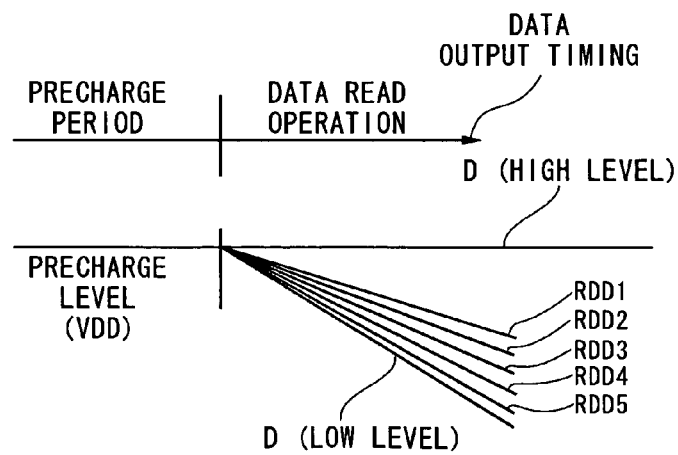
FIG. 4 is a view to explain adjustment when a first-selected reference voltage is lower than a center level.

If, however, the first selected reference level (RDD 3) is higher than the center level as shown in FIG. 3, or, it is lower than the center level as shown in FIG. 4, it is impossible to operate with a desired access time. In this case, the dummy cell 40 for generating a reference voltage is replaced with another dummy cell 40 by selecting another dummy cell 40. This allows operation with a desired access time or an access time close the desired access time.

Selecting the dummy cell 40 generating a reference voltage closer to the center level than RDD 3 enables operation with a desired access time.

In this way, if a reference voltage in a finished chip deviates from a target value at the time of design, the reference level can be corrected by selecting another one from a plurality of dummy cells 40 to reduce an access time compared to the case where this correction is not available. It is preferred, in this correction, to select the dummy cell 40 generating a reference voltage closest to the center level, which is, for example, the dummy cell 40 generating RDD 5 in FIG. 3 and the dummy cell 40 generating RDD 1 in FIG. 4.

The selection of the dummy cell 40 may be performed after producing a prototype of the semiconductor memory 1, for example. This allows suitable production of the semiconductor memory 1 with a good access time.

To select one of the dummy cells 40, an external input unit (not shown) outside of the semiconductor memory 1 may selectively input a reference voltage generation command signal to one of the dummy cells 40. Alternatively, the selection may be made by way of fuse cutting. In the case of fuse cutting, each signal line 43 serving as a transmission path of a generation command signal has a fuse (not shown). The fuse placed in the signal line 43 corresponding to the dummy cell 40 which is not finally selected is cut to prevent input of the generation command signal to the non-selected dummy cells 40.

As described in the foregoing, the semiconductor memory 1 of this embodiment has the plurality of dummy cells 40 having different current capacity as a means to generate a reference voltage so as to generate a plurality of different levels of reference voltages (for example, RDD 1 to RDD 5). By selectively using an appropriate reference voltage which is a center level between High and Low levels of memory cell data, it is possible to reduce a data output time or an access time.

Figure 5:
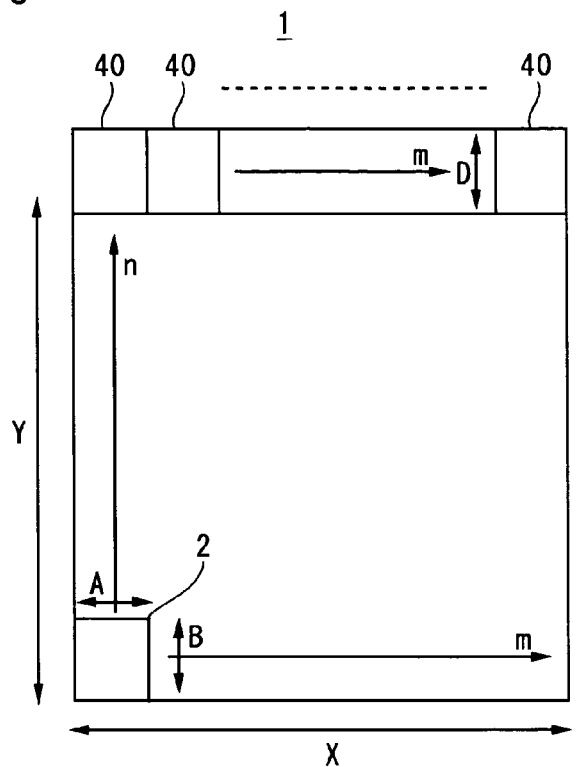
FIG. 5 is a diagram illustrating a layout image of a memory cell and a dummy cell in a semiconductor memory according to a specific embodiment of the present invention.
Figure 6:
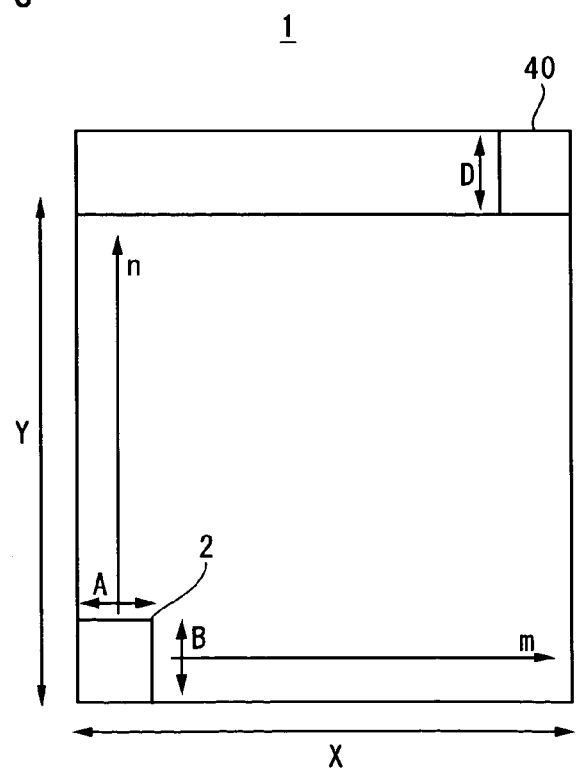
FIG. 6 is a comparative diagram to FIG. 5.

Since each dummy cell 40 generates a reference voltage based on a drive signal via a common dummy word line 51, that is, each dummy cell 40 is driven by a signal from a single dummy word line 51, and the number of dummy cells 40 is the same as the number of columns, m, in the memory cell array, there is no need to place a plurality of lines of dummy cells 40. It is thus possible to achieve a target reference voltage without increasing the area of the semiconductor memory 1. Hence, the area of the semiconductor memory 1 does not increase when it has the dummy cells 40 of the same number as columns as shown in FIG. 5, compared to when it has a single dummy cell 40 as shown in FIG. 6.

Figure 8:
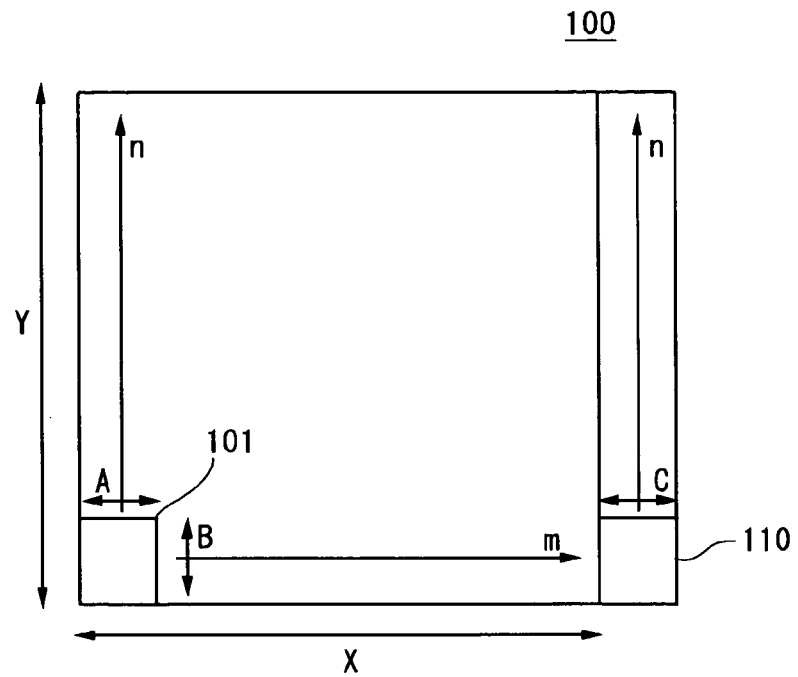
FIG. 8 is a diagram illustrating a layout image of a memory cell and a dummy cell in a conventional semiconductor memory.
Figure 9:
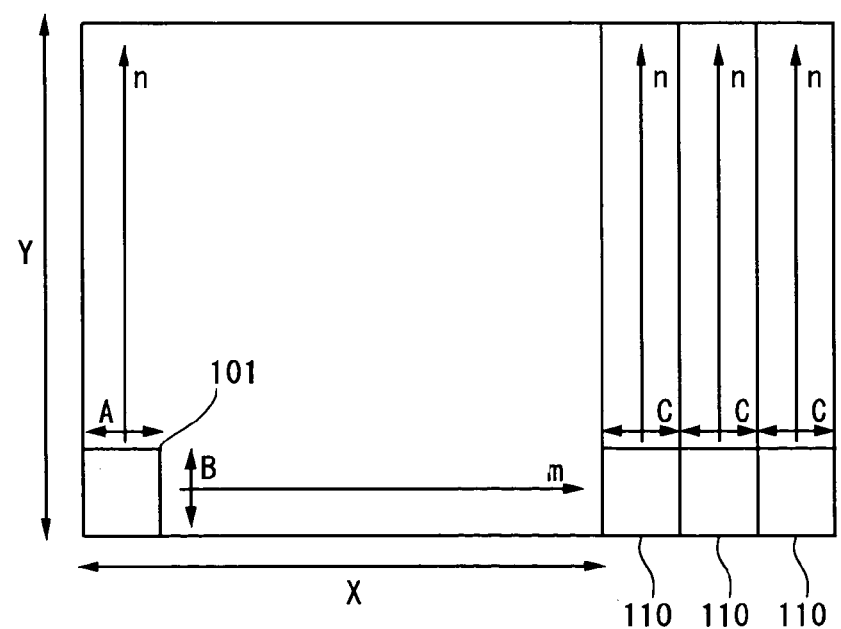
FIG. 9 is a diagram illustrating a layout image where lines of spare dummy cells are added to a conventional semiconductor memory.

FIG. 8 illustrates a layout image of the memory cell 101 and the dummy cell 110 in the semiconductor memory 100 having a conventional structure. FIG. 9 illustrates, for reference, a layout image of a semiconductor memory 200 where lines of spare dummy cells 110 are added to the structure of the semiconductor memory 100.

In order to generate a plurality of levels of reference voltages in the conventional semiconductor memory 100, it is necessary to place a plurality of lines of dummy cells 110, as in the semiconductor memory 200 shown in FIG. 9. This undesirably increases the area of the semiconductor memory 100 compared to the case with one level of reference voltage and one line of dummy cells 110 as shown in FIG. 8. By placing a plurality of dummy cells of the same number as or less number than columns and arranging the plurality of dummy cells in the row direction, it is possible to form a plurality of dummy cells without increasing the area of the semiconductor memory.

Figure 7:
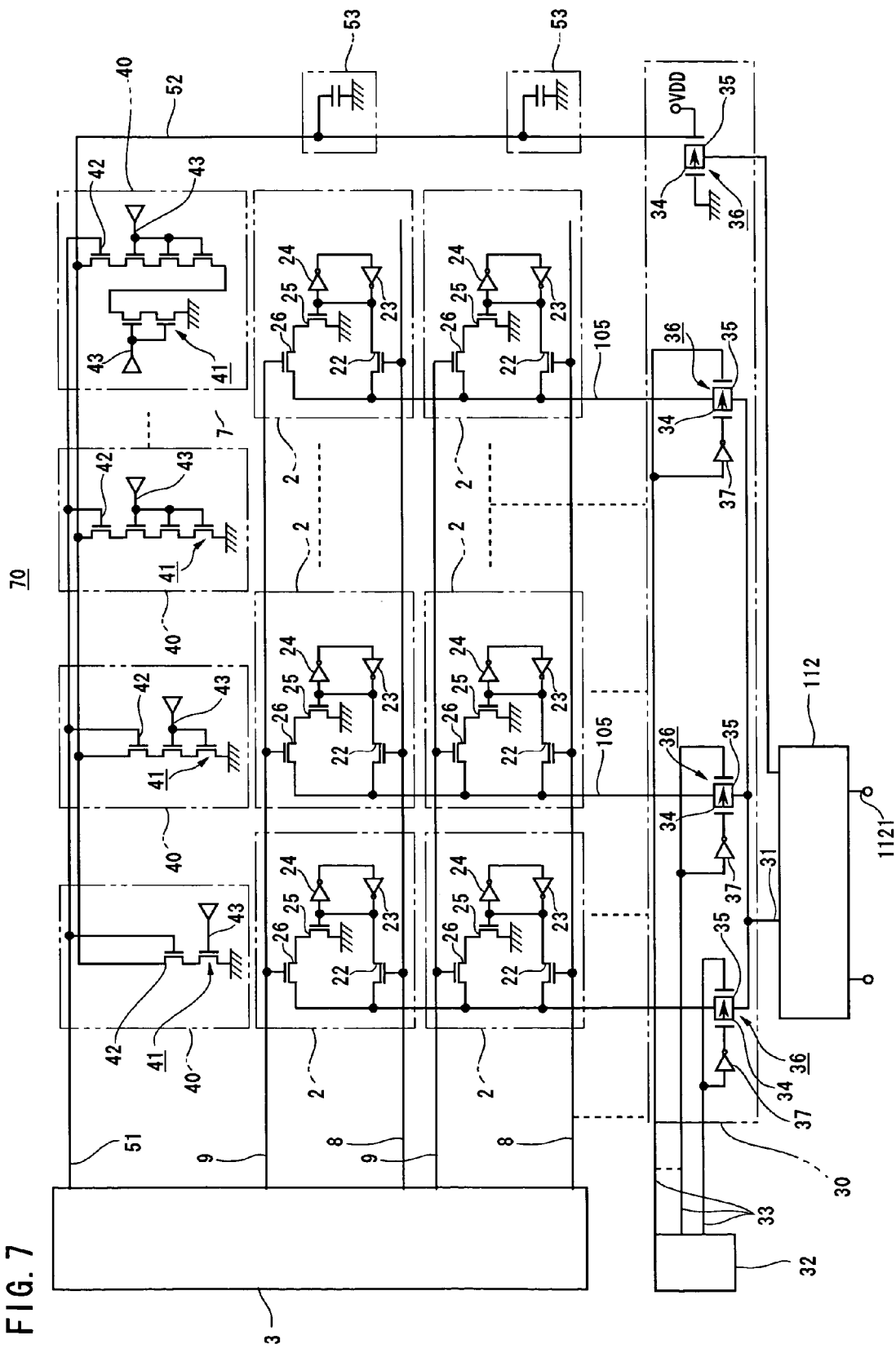
FIG. 7 is a circuit diagram illustrating a semiconductor memory according to another embodiment of the present invention.
Figure 10:
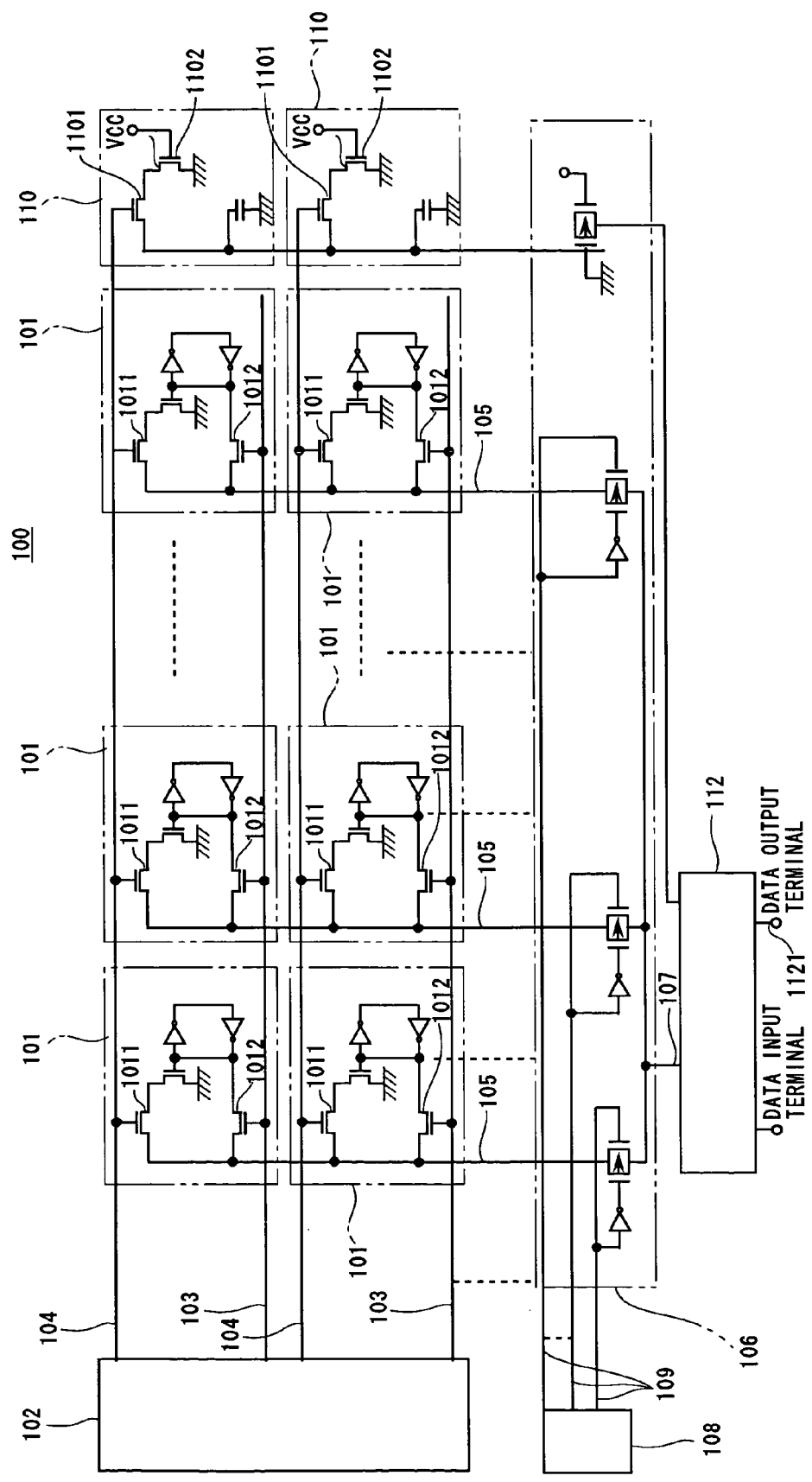
FIG. 10 is a circuit diagram illustrating a conventional semiconductor memory.
Figure 11:
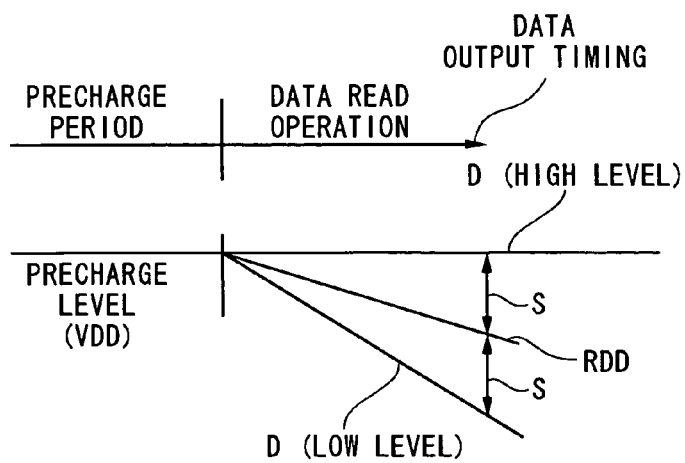
FIG. 11 is a view showing a change in voltage during data read operation when a reference level is a center level.
Figure 12:
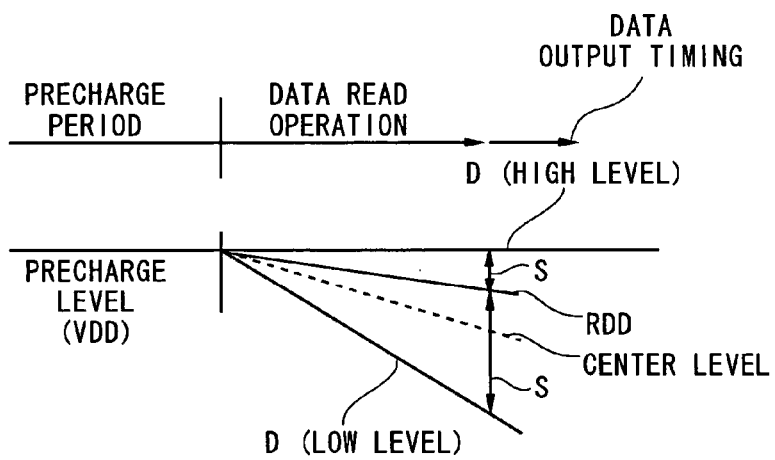
FIG. 12 is a view showing a change in voltage during data read operation when a reference level is higher than a center level.
Figure 13:
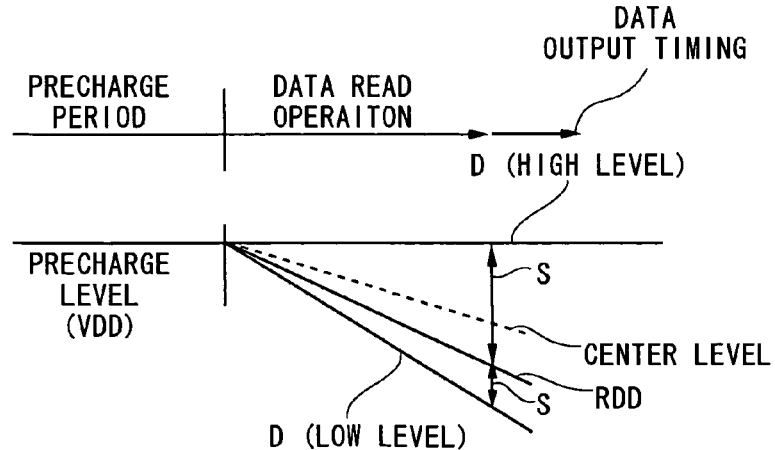
FIG. 13 is a view showing a change in voltage during data read operation when a reference level is lower than a center level.

The semiconductor memory 1 where each column has two write digit lines 7 has been explained in the above embodiment. Now, a semiconductor memory 70 according to another embodiment of the present invention is explained. The semiconductor memory 70, shown in FIG. 7, is composed of SRAM having a single port structure where a common digit line is used for both write and read operation. The semiconductor memory 70 is similar to the semiconductor memory 100 shown in FIG. 10 in that it has the single port structure. In the semiconductor memory 70 in FIG. 7, the same elements as in the semiconductor memory 1 or the conventional semiconductor memory 100 are denoted by the same reference symbols and redundant description is omitted.

The memory cell 2 in the semiconductor memory 70 is different from the memory cell 2 in the semiconductor memory 1 only in that it does not have the data write access transistor 21. Hence, the memory cell 2 in the semiconductor memory 70 is the same as the memory cell 101 in the conventional semiconductor memory 100.

Further, data read operation in the semiconductor memory 70 is the same as the operation in the semiconductor memory 1. Thus, this embodiment has the same advantages as the above embodiment.

Though the above two embodiments describe SRAM semiconductor memory, the present invention is not limited thereto, but is applicable to a semiconductor memory having other single-ended digit structures.

The above embodiments describe the structure where each dummy cell 40 has a different number of stages of driver transistor 41 so that the driver transistor 41 has different current capacity from each other. It is, however, possible to vary one or both of the gate length and gate width so that the current capacity of the driver transistor 41 differs from each other.

Further, the above embodiments describe the case of connecting the dummy capacitor 53 to the dummy digit line 52 to substantially equalize the capacitance of the output side of the memory cell 2 and the capacitance of the output side of the dummy cell 40. It is, however, also possible to adjust the line width of the dummy digit line 52 or the read digit line 10 so as to substantially equalize the capacitance of the lines 10 and 52.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor memory comprising:
   a plurality of memory cells, from each of which data is read via a line;
   a reference level generator circuit having a plurality of reference cells and being constructed to be capable of generating different reference levels with the plurality of reference cells and outputting a reference level having a substantially center level between two levels in a line used to read data from one of the memory cells; and
   a comparator circuit for comparing an output level from one of the memory cells with a reference level outputted from the reference level generator circuit, and outputting read data based on a comparison result.

2. A semiconductor memory according to claim 1, wherein the plurality of reference cells have different current capacity.

3. A semiconductor memory according to claim 2, wherein a driver transistor in each of the plurality of reference cells has different current capacity.

4. A semiconductor memory according to claim 3, wherein at least one parameter of gate length, gate width, and stage number of the driver transistor in each of the plurality of reference cells is different from each other.

5. A semiconductor memory according to claim 1, wherein each of the plurality of reference cells outputs a voltage via a common line.

6. A semiconductor memory according to claim 1, wherein each of the plurality of reference cells is driven by a drive signal via a common line.

7. A semiconductor memory according to claim 6, wherein the reference level generator circuit has the same number of reference cells as columns in a memory cell array including the plurality of memory cells, and a gate width and a gate length of an access transistor in each of the plurality of memory cells or the plurality of reference cells are substantially equal.

8. A semiconductor memory according to claim 6, wherein the reference level generator circuit has a smaller number of reference cells than columns in a memory cell array including the plurality of memory cells, and the plurality of reference cells are arranged in a row direction of the memory cell array.

9. A semiconductor memory according to claim 1, wherein the reference level generator circuit has a smaller number of reference cells than columns in a memory cell array including the plurality of memory cells, and the plurality of reference cells are arranged in a row direction of the memory cell array.

10. A semiconductor memory according to claim 1, wherein a capacitor connected to an output terminal of each of the plurality of reference cells has a substantially equal value to a capacitance of an output terminal of each of the plurality of memory cells.

11. A semiconductor memory according to claim 1, wherein the comparator circuit has a complementary level comparing sense amplifier for receiving a reference level and an output level from one of the memory cells, amplifying and outputting a difference between the two levels.

12. A semiconductor memory according to claim 1, wherein a reference level generation command signal is individually inputted to each of the plurality of reference cells.

13. A semiconductor memory comprising:
    a plurality of memory cells, from each of which data is read via a line;
    a reference level generator circuit having a plurality of reference cells and being constructed to be capable of generating different reference levels with the plurality of reference cells; and
    a comparator circuit for comparing an output level from one of the memory cells with a reference level outputted from the reference level generator circuit, and outputting read data based on a comparison result,
    wherein each input path of a generation command signal to each of the plurality of reference cells has a fuse for, if a corresponding reference cell is not selected to generate a reference level, invalidating input of the generation command signal to the corresponding reference cell.

14. A semiconductor memory according to claim 1, wherein the reference level generator circuit outputs an output voltage of one reference cell selected from the plurality of reference cells as a reference level.

15. A semiconductor memory comprising:
    a plurality of memory cells, from each of which data is read via a line;
    a reference level generator circuit having a plurality of reference cells and being constructed to be capable of generating different reference levels with the plurality of reference cells; and
    a comparator circuit for comparing an output level from one of the memory cells with a reference level outputted from the reference level generator circuit, and outputting read data based on a comparison result,
    wherein the selected reference cell outputs a voltage level closest to a center level between two levels in a line used to read data from one of the memory cells.

16. A semiconductor memory comprising:
    a plurality of memory cells, from each of which data is read via a line;
    a reference level generator circuit having a plurality of reference cells and being constructed to be capable of generating different reference levels with the plurality of reference cells; and
    a comparator circuit for comparing an output level from one of the memory cells with a reference level outputted from the reference level generator circuit, and outputting read data based on a comparison result, wherein the reference level generator circuit outputs an output voltage of one reference cell selected from the plurality of reference cells as a reference level, and wherein a reference level generation command signal is selectively inputted to the selected reference cell of the plurality of reference cells.

17. A semiconductor memory comprising:

a plurality of memory cells, from each of which data is read via a line;

a reference level generator circuit having a plurality of reference cells and being constructed to be capable of generating different reference levels with the plurality of reference cells; and a comparator circuit for comparing an output level from one of the memory cells with a reference level outputted from the reference level generator circuit, and outputting read data based on a comparison result, wherein the reference level generator circuit outputs an output voltage of one reference cell selected from the plurality of reference cells as a reference level, and wherein input of the generation command signal is invalidated by fuse cut to a reference cell not selected to generate a reference level.

18. A semiconductor memory comprising:

a plurality of memory cells, from each of which data is read via a line;

a reference level generator circuit having a plurality of reference cells and being constructed to be capable of generating different reference levels with the plurality of reference cells; and a comparator circuit for comparing an output level from one of the memory cells with a reference level outputted from the reference level generator circuit, and outputting read data based on a comparison result, wherein the reference level generator circuit outputs an output voltage of one reference cell selected from the plurality of reference cells as a reference level, and wherein an external signal controls selection of one reference cell from the plurality of reference cells.

19. A semiconductor memory comprising:

a plurality of memory cells, each for outputting a first-level or a second level in accordance with stored data;

a reference level generator circuit having a plurality of reference cells with different output levels, for generating a reference level with output from one reference cell preselected from the plurality of reference cells for outputting a substantially center level between the first and second output levels; and a comparator circuit for comparing an output level from one of the plurality of memory cells with a reference level outputted from the reference level generator circuit, and outputting read data based on a comparison result.

20. A semiconductor memory according to claim 19, wherein an output level from the selected reference cell is closer to a center level between the first and second output levels than any other output levels from the plurality of reference cells.

* * * * *